(12) United States Patent
Kim

(10) Patent No.: US 8,724,405 B2
(45) Date of Patent: May 13, 2014

(54) SEMICONDUCTOR APPARATUS

(75) Inventor: Hong Gyeom Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/599,910

(22) Filed: Aug. 30, 2012

(65) Prior Publication Data

US 2013/0279274 A1 Oct. 24, 2013

(30) Foreign Application Priority Data

Apr. 20, 2012 (KR) .................. 10-2012-0041365

(51) Int. Cl.
*G11C 7/00* (2006.01)
*G11C 17/18* (2006.01)

(52) U.S. Cl.
USPC .................................. 365/189.11; 365/225.7

(58) Field of Classification Search
USPC ......................... 365/189.11, 225.7
See application file for complete search history.

(56) References Cited

U.S. PATENT DOCUMENTS

| | | | |
|---|---|---|---|
| 7,603,592 B2 * | 10/2009 | Sekiguchi et al. | 714/710 |
| 2005/0270863 A1 * | 12/2005 | Kim et al. | 365/200 |
| 2008/0055324 A1 * | 3/2008 | Kodaira et al. | 345/530 |
| 2009/0122632 A1 * | 5/2009 | Kwak et al. | 365/225.7 |

FOREIGN PATENT DOCUMENTS

| | | |
|---|---|---|
| KR | 10-0256127 B1 | 2/2000 |
| KR | 10-0729368 B1 | 6/2007 |

* cited by examiner

*Primary Examiner* — Ly D Pham

(74) *Attorney, Agent, or Firm* — William Park & Associates Patent Ltd.

(57) ABSTRACT

A semiconductor apparatus includes: a memory cell block configured to store data; a fuse block including a plurality of fuses configured to store fuse information; an I/O driver configured to output the data transmitted through a global line to a pad; and a fuse driver configured to output the fuse information transmitted through a test global line to the pad during a test mode.

16 Claims, 6 Drawing Sheets under 35 U.S.C.
SEMICONDUCTOR APPARATUS

CROSS-REFERENCES TO RELATED APPLICATION

The present application claims priority under 35 U.S.C. §119(a) to Korean application number 10-2012-0041365 filed on Apr 20, 2012 in the Korean Intellectual Property Office, which is incorporated herein by reference in its entirety.

BACKGROUND

1. Technical Field

The present invention relates to a semiconductor apparatus, and more particularly, to a test mode of a semiconductor apparatus.

2. Related Art

When any one failed unit cell from among numerous unit cells of a semiconductor memory apparatus is detected during a fabrication process of the semiconductor memory apparatus, the semiconductor memory apparatus is typically discarded as a defective product. However, it is inefficient to discard the semiconductor memory apparatus as a defective product even though defects occur in only some unit cells thereof. The semiconductor memory apparatus may be restored by replacing the failed unit cells with redundancy cells prepared therein, which makes it possible to improve product yield.

At a package level, a repair operation is performed using an anti-fuse. In general, the anti-fuse may be formed of a thin dielectric material such as a complex in which a dielectric such as $SiO_2$, silicon nitride, tantalum oxide, or ONO (silicon dioxide-silicon nitride-silicon dioxide) is interposed between two conductors. The anti-fuse is electrically open in a normal state. However, when a high voltage is applied to destroy the dielectric between the conductors, the anti-fuse is shorted. That is, when a failed cell is to be replaced at the package level, a programming operation of applying a high voltage to an anti-fuse circuit is performed. After the programming operation, the anti-fuse is shorted which results in the failed cell being replaced with a redundancy cell.

FIG. 1 is a block diagram of a conventional semiconductor apparatus.

FIG. 1 illustrates such a configuration that outputs data stored in a memory cell block including main memory cells and redundancy memory cells.

The semiconductor apparatus includes a decoder 1, a memory cell block 2, a fuse block 3, and an I/O driver 4.

The decoder 1 is configured to decode a received address ADD and to generate a cell select signal X_YADD when a command CMD is inputted.

The fuse block 3 includes a plurality of fuses, and is configured to receive the cell select signal X_YADD and output fuse information FUSE according to whether or not a corresponding fuse is programmed.

The memory cell block 2 includes a main memory cell block (not illustrated) and a redundancy memory cell block (not illustrated). When deactivated fuse information FUSE is inputted, data stored in a main memory cell selected according to the cell select signal X_YADD is outputted, but when activated fuse information FUSE is inputted, data stored in a redundancy memory cell substituted for the main memory cell is outputted.

The I/O driver 4 is configured to output the data transmitted through a global line GIO to a pad PAD.

That is, the data stored in the memory cell selected according to the inputted address ADD or the redundancy memory cell is outputted to the outside through the global line GIO and the I/O driver 4.

At this time, in order to monitor whether or not fuses included in the fuse block 3 were normally programmed according to the fail cell information, the data stored in the redundancy memory cell substituted by the fuse information FUSE is outputted and checked. In this method, however, the fuse information FUSE outputted from the fuse block 3 is not directly monitored, but measured through data transmitted from the memory cell block 2. Therefore, precision may be degraded.

FIG. 2 is a block diagram of a conventional multi-chip semiconductor apparatus.

In order to highly integrate a semiconductor apparatus, various types of multi-chip packaging methods have been proposed. In particular, a chip stack method is widely used, which stacks a plurality of semiconductor chips to form one semiconductor apparatus.

In general, a multi-chip semiconductor apparatus is divided into a homogeneous structure where the same semiconductor chips are stacked and a heterogeneous structure where semiconductor chips having different functions are stacked.

A semiconductor apparatus including a plurality of stacked slave chips and a master chips is one example of a heterogeneous structure. Each of the slave chips has a core area including a memory cell block, and the master chip serves to exchange signals between the slave chips and an external processor and control signal exchanges.

Referring to FIG. 2, the semiconductor apparatus includes a master chip MASTER CHIP and a plurality of slave chips SLAVE CHIP1 to SLAVE CHIPn. The semiconductor apparatus is connected to an external processor through a pad PAD formed in the master chip MASTER CHIP. FIG. 2 illustrates a multi-chip semiconductor apparatus in which a plurality of chips are electrically connected through a through-chip via TSV, for an example.

The plurality of slave chips SLAVE CHIP1, SLAVE CHIP2 include memory cell blocks 2_1, 2_2, respectively. Each of the memory cell blocks 2_1, 2_2 includes a main memory cell and a redundancy memory cell, and data stored in the memory cells are transmitted to the master chip MASTER CHIP through a global line.

The master chip MASTER CHIP may includes the decoder 1, the fuse block 3, and the I/O driver 4. The operations of the decoder 1, the fuse block 3, and the I/O driver 4 may be performed as described with reference to FIG. 1. That is, the decoder 1 generates a cell select signal, and the fuse block 3 generates a fuse signal. The memory cell blocks 2_1, 2_2 transmit corresponding data to the I/O driver 4 through the global line in response to the cell select signal and the fuse signal. The I/O driver 4 outputs the received data outside the semiconductor apparatus through the pad PAD.

In order to monitor whether or not fuses included in the fuse block 3 provided in the master chip MASTER CHIP were normally programmed according to fail cell information, data stored in the redundancy memory cell substituted by fuse information FUSE must be outputted and checked. Therefore, all of the slave chips SLAVE CHIP1, SLAVE CHIP2 must be stacked even during a test.

SUMMARY

In one embodiment of the present invention, a semiconductor apparatus includes: a memory cell block configured to store data; a fuse block including a plurality of fuses configured to store fuse information; an I/O driver configured to output the data transmitted through a global line to a pad; and a fuse driver configured to output the fuse information transmitted through a test global line to the pad during a test mode.

In another embodiment of the present invention, a semiconductor apparatus includes: a decoder configured to decode an inputted address to generate a fuse select signal, when a read command is applied during a test mode; a fuse block including a plurality of fuses and configured to output fuse information of a fuse selected according to the fuse select signal, where the fuse information is transmitted via a test global line; and a fuse driver configured to output the fuse information transmitted to a test global line to a pad during the test mode.

In another embodiment of the present invention, a semiconductor apparatus includes a master chip and a plurality of slave chips, which are electrically connected and stacked. Each of the slave chips includes a memory cell block configured to store data, and the master chip includes: a fuse block including a plurality of fuses configured to store fuse information; an I/O driver configured to output the data transmitted through a global line to a pad; and a fuse driver configured to output the fuse information transmitted through a test global line to the pad during a test mode.

In another embodiment of the present invention, a semiconductor apparatus includes a master chip and a plurality of slave chips, which are electrically connected through a through-chip via and stacked. Each of the slave chips includes a memory cell block configured to store data, and the master chip includes: a decoder configured to decode an inputted address to generate a fuse select signal, when a read command is applied during a test mode; a fuse block including a plurality of fuses and configured to output fuse information of a fuse selected according to the fuse select signal; an I/O driver configured to output the data transmitted through a global line to a pad during a normal operation mode; and a fuse driver configured to output the fuse information transmitted through a test global line to the pad during the test mode.

BRIEF DESCRIPTION OF THE DRAWINGS

Features, aspects, and embodiments are described in conjunction with the attached drawings, in which.

DETAILED DESCRIPTION

Hereinafter, a semiconductor apparatus according to the present invention will be described below with reference to the accompanying drawings through example embodiments.

Figure 1:
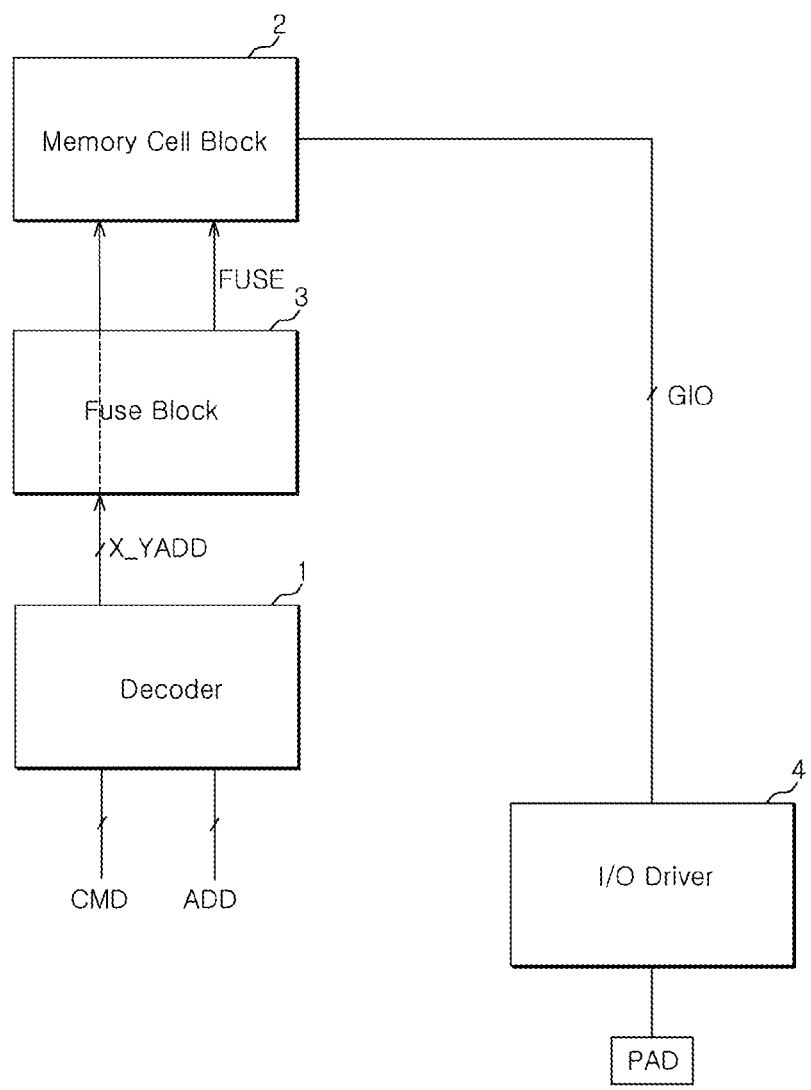
FIG. 1 is a block diagram of a conventional semiconductor apparatus.
Figure 2:
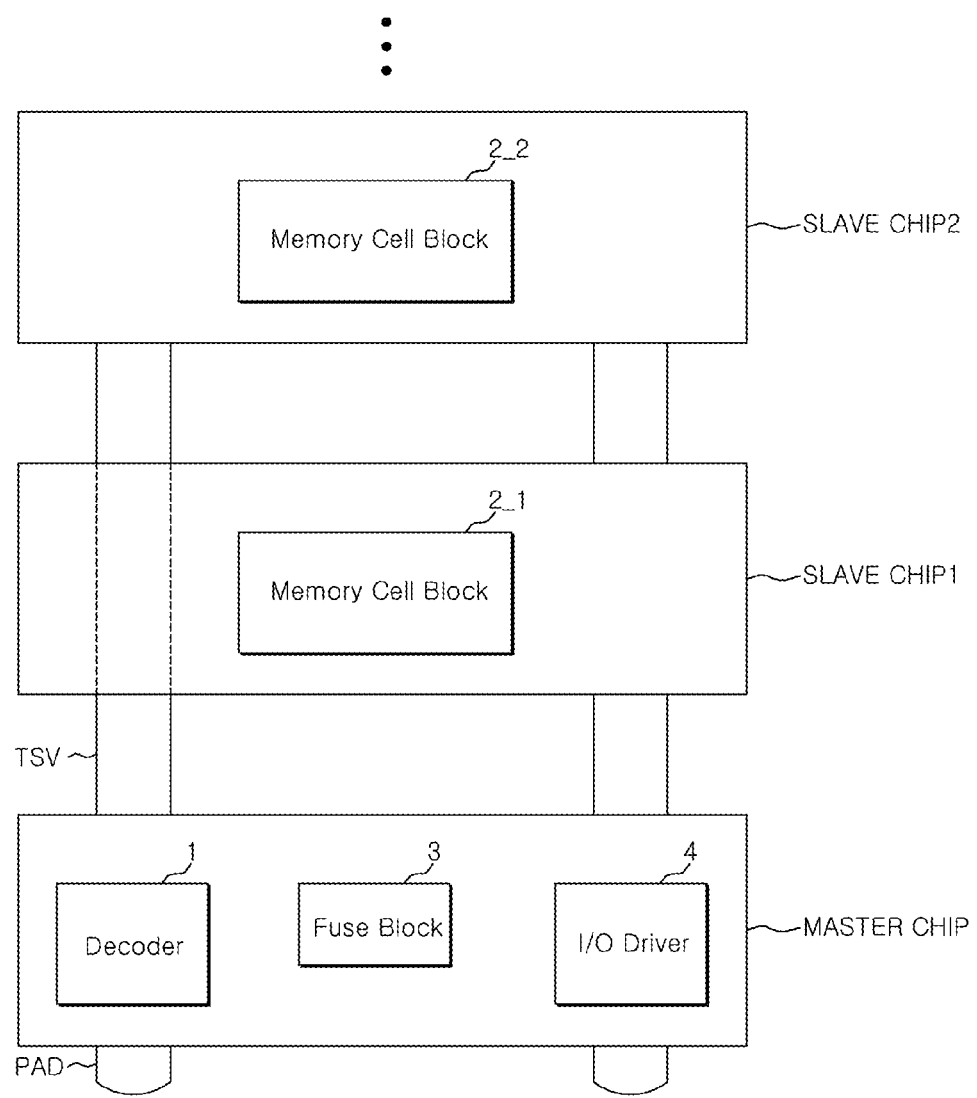
FIG. 2 is a block diagram of a conventional multi-chip semiconductor apparatus.
Figure 3:
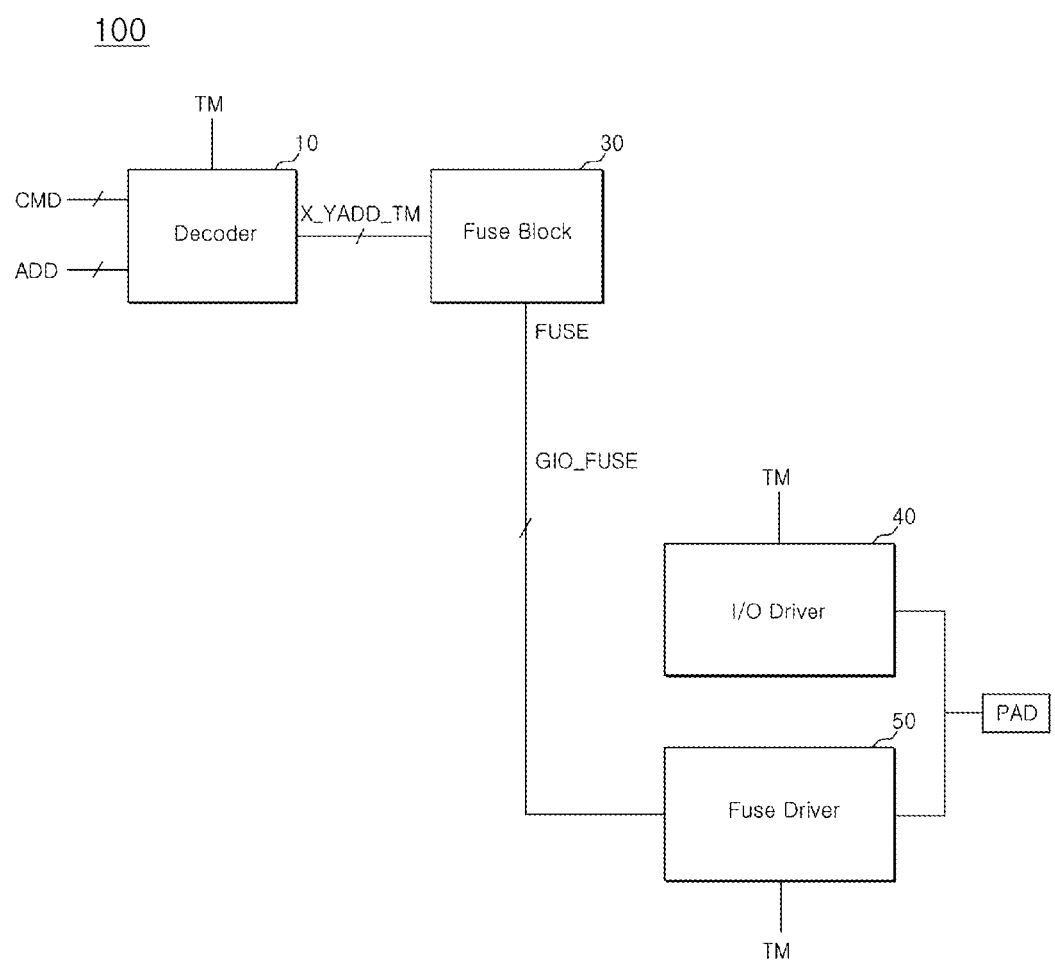
FIG. 3 is a block diagram of a semiconductor apparatus according to one embodiment of the present invention.

FIG. 3 is a block diagram of a semiconductor apparatus 100 according to one embodiment of the present invention.

The semiconductor apparatus 100 illustrated in FIG. 3 includes a decoder 10, a fuse block 30, an I/O driver 40, and a fuse driver 50.

The I/O driver 40 is configured to output data transmitted from a memory cell block (not illustrated) through a global line (not illustrated) to a pad PAD during a normal operation mode, and is not driven when an activated test mode signal TM is applied. The activated test mode signal TM may indicate that the semiconductor apparatus 100 is operating in a test mode.

The decoder 10 is configured to decode a received address ADD to generate a fuse select signal X_YADD_TM, when an activated test mode signal TM is applied and a command CMD is inputted during the test mode. For example, when a read command is inputted during the test mode, the decoder 10 decodes the received address ADD and generates the fuse select signal X_YADD_TM. The decoder 10 may be enabled in response an activated test mode signal TM.

The fuse block 30 includes a plurality of fuses, and is configured to receive the fuse select signal X_YADD_TM and output fuse information FUSE stored therein to a test global line GIO_FUSE according to whether or not a fuse corresponding to the fuse select signal X_YADD_TM was programmed. When a fail occurred in a corresponding memory cell and the corresponding fuse was programmed, the fuse block 30 may output the activated fuse information FUSE, and when the corresponding memory cell is normal, the fuse block 30 may output the deactivated fuse information FUSE.

The fuse driver 50 is not driven during a normal operation mode, but the fuse driver 50 outputs the fuse information FUSE transmitted through the test global line GIO_FUSE to a pad PAD, when the activated test mode signal TM is applied, that is during the test mode. The fuse driver 50 may be enabled in response to an activated test mode signal TM.

In other words, in the normal operation mode, the semiconductor apparatus 100 may output data—stored in a memory cell selected according to the inputted address ADD or a redundancy memory cell—through the global line (not illustrated) and the I/O driver 40. In the test mode, however, the semiconductor apparatus may output the fuse information FUSE—where the fuse information FUSE may be selected according to the inputted address ADD—through the test global line GIO_FUSE and the fuse driver 50.

Figure 4:
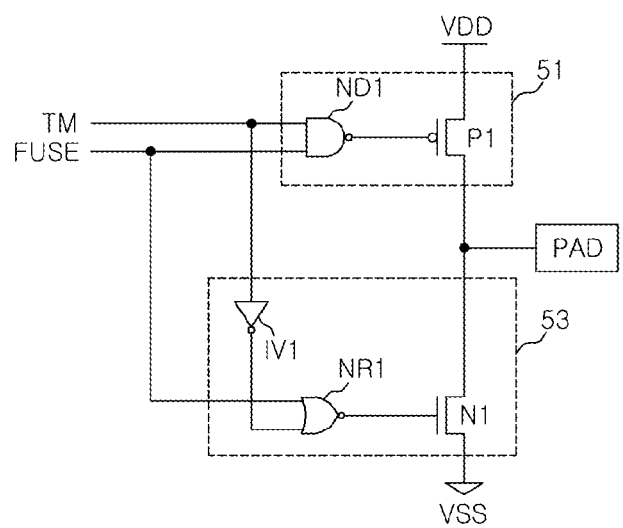
FIG. 4 is a circuit diagram of a fuse driver of FIG. 3.

FIG. 4 is a circuit diagram of the fuse driver 50.

The fuse driver 50 includes a pull-up unit 51 and a pull-down unit 53.

The pull-up unit 51 is configured to drive an external voltage level VDD to the pad PAD when the activated fuse information FUSE is applied to the fuse driver 50 during the test mode.

On the other hand, the pull-down unit 53 is configured to output a ground voltage level VSS to the pad PAD when deactivated fuse information FUSE is applied to the fuse driver 50 during the test mode.

Therefore, when the fuse corresponding to the inputted address ADD was programmed, fuse information FUSE activated to a high level is outputted to the outside during the test mode, that is, outside the semiconductor apparatus 100 via the pad PAD. When the fuse corresponding to the inputted address ADD was not programmed, fuse information FUSE deactivated to a low level is outputted to the outside during the test mode.

The pull-up unit 51 includes a NAND gate ND1 and a PMOS transistor P1.

The NAND gate ND1 is configured to receive the test mode signal TM and the fuse information FUSE and perform a NAND operation on the received signals.

The PMOS transistor P1 is configured to receive an output signal of the NAND gate ND1 and drive the external voltage VDD to the pad PAD.

That is, when the activated test mode signal TM and the activated fuse information FUSE are applied, the PMOS transistor P1 is turned on to output a signal corresponding to the external voltage level VDD to the pad PAD.

The pull-down unit 53 includes an inverter IV1, a NOR gate NR1, and an NMOS transistor N1.

The inverter IV1 is configured to receive the test mode signal TM and invert the received test mode signal TM.

The NOR gate NR1 is configured to receive the inverted test mode signal TM and the fuse information FUSE and perform a NOR operation on the received signals.

The NMOS transistor N1 is configured to receive an output signal of the NOR gate NR1 and discharge the voltage level of a signal outputted to the pad PAD to the ground voltage level VSS.

That is, when the activated test mode signal TM and the deactivated fuse information FUSE are applied, the NMOS transistor N1 is turned on to output a signal corresponding to the ground voltage level VSS to the pad PAD.

The size of the transistors P1 and N1 forming the pull-up unit 51 and the pull-down unit 53, respectively, is set to have a smaller size than that of transistors forming the I/O driver 40 such that the transistors P1 and N1 do not have an effect on data output during a normal operation mode.

Figure 5:
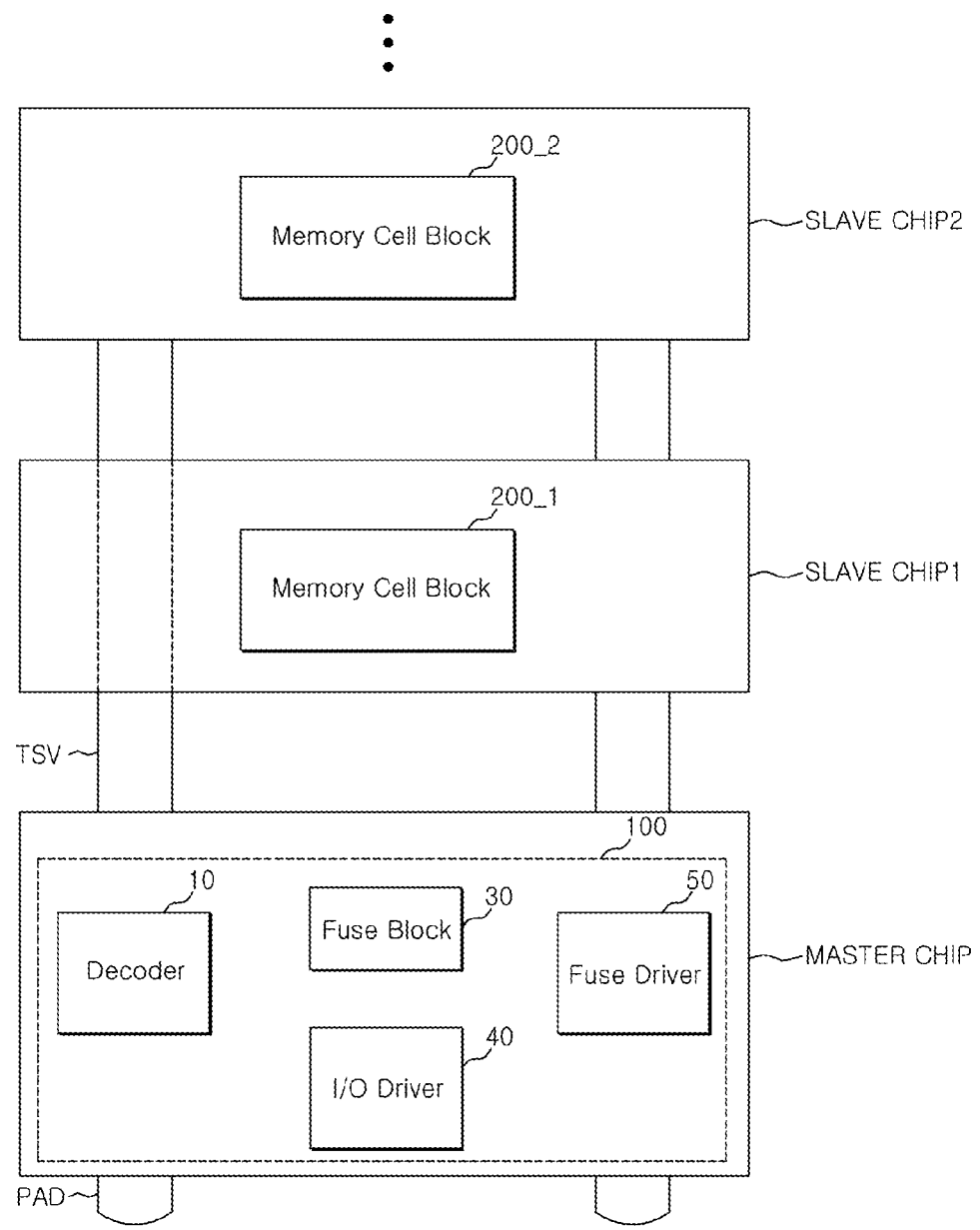
FIG. 5 is a block diagram of a multi-chip semiconductor apparatus according to another embodiment of the present invention.

FIG. 5 is a block diagram of a multi-chip semiconductor apparatus according to another embodiment of the present invention.

The semiconductor apparatus illustrated in FIG. 5 includes a master chip MASTER CHIP and a plurality of slave chips SLAVE CHIP1, SLAVE CHIP2. The semiconductor apparatus is connected to an external processor through a pad PAD formed in the master chip MASTER CHIP. FIG. 5 illustrates a multi-chip semiconductor apparatus in which chips are electrically connected through a through-chip via TSV.

The plurality of slave chips SLAVE CHIP1, SLAVE CHIP2 include memory cell blocks 200_1, 200_2, configured to store data, respectively. Each of the memory cell blocks 200_1, 200_2 includes a main memory cell and a redundancy memory cell, and data stored in the memory cells are transmitted to the master chip MASTER CHIP through a global line (not illustrated) during a normal operation mode.

The master chip MASTER CHIP includes the configuration of the semiconductor apparatus 100 illustrated in FIG. 3. That is, the master chip MASTER CHIP includes the decoder 10, the fuse block 30, the I/O driver 40, and the fuse driver 50, which are configured in a substantially similar manner as described above.

The I/O driver 40 is configured to receive data transmitted through the global line (not illustrated) from the slave chips SLAVE CHIP1, SLAVE CHIP2 and output the received data to the pad PAD, during a normal operation mode.

The decoder 10 is configured to decode a received address ADD to generate a fuse select signal X_YADD_TM, when an activated test mode signal TM is applied and a command CMD is inputted during a test mode. For example, when a read command is inputted during the test mode, the decoder 10 decodes the received address ADD and generates the fuse select signal X_YADD_TM.

The fuse block 30 includes a plurality of fuses, and is configured to receive the fuse select signal X_YADD_TM and output fuse information FUSE to a test global line GIO_FUSE according to whether or not a fuse corresponding to the fuse select signal X_YADD_TM was programmed. When a fail occurred in a corresponding memory cell and the corresponding fuse was programmed, the fuse block 30 may output the activated fuse information FUSE, and when the corresponding memory cell is normal, the fuse block 30 may output the deactivated fuse information FUSE.

The fuse driver 50 is configured to output the fuse information FUSE transmitted through the test global line GIO_FUSE to the pad PAD when the activated test mode signal TM is applied during the test mode. The fuse driver 50 may be configured in a substantially same manner as described with reference to FIG. 4.

Therefore, the semiconductor apparatus according to an embodiment of the present invention outputs data transmitted through the global line (not illustrated) from the slave chips SLAVE CHIP1, SLAVE CHIP2 to the outside through the I/O driver 40 during a normal operation mode, but outputs the fuse information FUSE generated by the fuse block 30 provided in the master chip MASTER CHIP to the outside through the test global line GIO_FUSE and the fuse driver 50 during the test mode. Therefore, the slave chips SLAVE CHIP1, SLAVE CHIP2 do not need to be stacked in order to check whether or not a fuse was programmed, but only the master chip MASTER CHIP may be needed to monitor whether or not a fuse was programmed.

Figure 6:
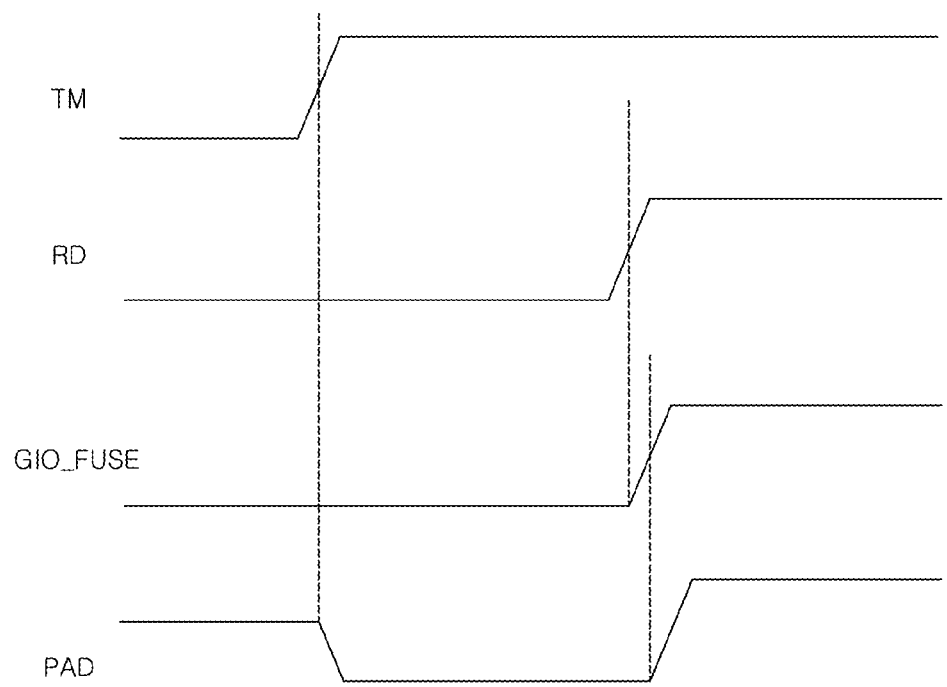
FIG. 6 is a waveform diagram illustrating an operation of the semiconductor apparatuses of FIGS. 3 and 5.

FIG. 6 is a waveform diagram illustrating operations of the semiconductor apparatuses of FIGS. 3 and 5.

During a normal operation mode, data loaded in the global line is outputted to the outside through the pad PAD from the I/O driver 40.

On the other hand, when the activated test mode signal TM is applied to the semiconductor apparatus 100, i.e., during the test mode, the fuse information loaded in the test global line GIO_FUSE is outputted to the outside through the pad PAD from the fuse driver 50.

Before a read command RD is applied, a signal deactivated to a low level is outputted to the pad PAD according to an initial setting. Then, when the read command RD is applied and the activated fuse information is transmitted to the test global line GIO_FUSE, an activated signal is outputted to the pad PAD.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
    a memory cell block configured to store data;
    a fuse block comprising a plurality of fuses configured to store fuse information;
    an I/O driver configured to output the data transmitted through a global line to a pad; and
    a fuse driver configured to output the fuse information transmitted through a test global line to the pad during a test mode.

2. The semiconductor apparatus according to claim 1, wherein the fuse driver comprises:
    a pull-up unit configured to drive an external voltage level to the pad when the fuse information is activated during the test mode; and
    a pull-down unit configured to output a ground voltage level to the pad when the fuse information is deactivated during the test mode.

3. The semiconductor apparatus according to claim 2, wherein the pull-up unit comprises:

a NAND gate configured to receive the fuse information and a test mode signal activated during the test mode; and a PMOS transistor configured to receive an output signal of the NAND gate and drive the external voltage.

4. The semiconductor apparatus according to claim 3, wherein the pull-down unit comprises:
a NOR gate configured to receive the inverted test mode signal and the fuse information; and
an NMOS transistor configured to receive an output signal of the NOR gate and discharge a voltage level of a signal outputted to the pad to a ground voltage level.

5. The semiconductor apparatus according to claim 4, wherein the PMOS and NMOS transistors are set to have a smaller size than transistors included in the I/O driver.

6. The semiconductor apparatus according to claim 1, further comprising a decoder configured to decode an inputted address to generate a fuse select signal, when a read command is applied during the test mode,
wherein the fuse block is configured to output the fuse information of a fuse selected according to the fuse select signal, where the fuse information is transmitted via a test global line.

7. The semiconductor apparatus according to claim 6, wherein the decoder and the fuse driver are enabled in response to a test mode signal activated during the test mode.

8. The semiconductor apparatus according to claim 7, wherein the fuse block outputs the activated fuse information when the fuse selected according to the fuse select signal is programmed.

9. A semiconductor apparatus comprising:
a master chip and a plurality of slave chips, which are electrically connected and stacked,
wherein each of the slave chips comprises a memory cell block configured to store data, and
the master chip comprises:
a fuse block comprising a plurality of fuses configured to store fuse information;
an I/O driver configured to output the data transmitted through a global line to a pad; and
a fuse driver configured to output the fuse information transmitted through a test global line to the pad during a test mode.

10. The semiconductor apparatus according to claim 9, wherein the fuse driver comprises:
a pull-up unit configured to drive an external voltage level to the pad when the fuse information is activated during the test mode; and
a pull-down unit configured to output a ground voltage level to the pad when the fuse information is deactivated during the test mode.

11. The semiconductor apparatus according to claim 10, wherein the pull-up unit comprises:
a NAND gate configured to receive the fuse information and a test mode signal activated during the test mode; and
a PMOS transistor configured to receive an output signal of the NAND gate and drive the external voltage.

12. The semiconductor apparatus according to claim 11, wherein the pull-down unit comprises:
a NOR gate configured to receive the inverted test mode signal and the fuse information; and
an NMOS transistor configured to receive an output signal of the NOR gate and discharge a voltage level of a signal outputted to the pad to a ground voltage level.

13. The semiconductor apparatus according to claim 12, wherein the PMOS and NMOS transistors are set to have a smaller size than transistors included in the I/O driver.

14. The semiconductor apparatus according to claim 9, further comprising a decoder configured to decode an inputted address to generate a fuse select signal, when a read command is applied during the test mode,
wherein the fuse block is configured to output the fuse information of a fuse selected according to the fuse select signal, where the fuse information is transmitted via a test global line.

15. The semiconductor apparatus according to claim 14, wherein the decoder and the fuse driver are enabled in response to a test mode signal activated during the test mode.

16. The semiconductor apparatus according to claim 15, wherein the fuse block outputs the activated fuse information when the fuse selected according to the fuse select signal is programmed.

* * * * *